(12) United States Patent
Yoshida

(10) Patent No.: US 11,145,742 B2
(45) Date of Patent: Oct. 12, 2021

(54) PROCESS OF FORMING NITRIDE SEMICONDUCTOR DEVICE

(71) Applicant: SUMITOMO ELECTRIC INDUSTRIES, LTD., Osaka (JP)

(72) Inventor: Tomohiro Yoshida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/196,696

(22) Filed: Nov. 20, 2018

(65) Prior Publication Data

US 2019/0165130 A1  May 30, 2019

(30) Foreign Application Priority Data

Nov. 24, 2017  (JP) .............................. JP2017-225868

(51) Int. Cl.
| | |
|---|---|
| *H01L 29/66* | (2006.01) |
| *H01L 21/02* | (2006.01) |
| *H01L 21/308* | (2006.01) |
| *H01L 29/205* | (2006.01) |
| *H01L 29/20* | (2006.01) |

(Continued)

(52) U.S. Cl.
CPC .... *H01L 29/66462* (2013.01); *H01L 21/0217* (2013.01); *H01L 21/0254* (2013.01); *H01L 21/0262* (2013.01); *H01L 21/02164* (2013.01); *H01L 21/02271* (2013.01); *H01L 21/02576* (2013.01); *H01L 21/0331* (2013.01); *H01L 21/3081* (2013.01); *H01L 21/3086* (2013.01); *H01L 21/30621* (2013.01); *H01L 29/0891* (2013.01); *H01L 29/2003* (2013.01); *H01L 29/205* (2013.01); *H01L 29/42316* (2013.01); *H01L 21/0274* (2013.01); *H01L 21/02458* (2013.01); *H01L 21/31116* (2013.01); *H01L 29/452* (2013.01)

(58) Field of Classification Search
None
See application file for complete search history.

(56) References Cited

U.S. PATENT DOCUMENTS

| | | | |
|---|---|---|---|
| 8,772,786 B2 * | 7/2014 | Tabatabaie | ........ H01L 29/66462 257/76 |
| 9,837,499 B2 * | 12/2017 | Then | ................. H01L 29/66462 |

(Continued)

FOREIGN PATENT DOCUMENTS

JP  2008-227432  9/2008

*Primary Examiner* — Abul Kalam
(74) *Attorney, Agent, or Firm* — Smith, Gambrell & Russell, LLP.

(57) ABSTRACT

A process of forming a nitride semiconductor device is disclosed. The process includes steps of: (a) forming insulating films on a semiconductor stack, where the insulating films include a first silicon nitride (SiN) film, a silicon oxide (SiO$_2$) film, and a second SiN film; (b) forming an opening in the insulating films; (c) widening the opening in the SiO$_2$ film; (d) forming a recess in the semiconductor stack using the insulating films as a mask; (e) growing a doped region within the recess and simultaneously depositing the nitride semiconductor material constituting the doped region on the second SiN film; and (f) removing the nitride semiconductor material deposited on the second SiN film and the second SiN film by removing the SiO$_2$ film.

12 Claims, 5 Drawing Sheets

(51) Int. Cl.
  *H01L 29/423*    (2006.01)
  *H01L 21/306*    (2006.01)
  *H01L 29/08*     (2006.01)
  *H01L 21/033*    (2006.01)
  H01L 21/311     (2006.01)
  H01L 29/45      (2006.01)
  H01L 21/027     (2006.01)

(56) References Cited

U.S. PATENT DOCUMENTS

| | | | |
|---|---|---|---|
| 10,147,811 B2 * | 12/2018 | Nakata | H01L 21/0254 |
| 2017/0092747 A1 * | 3/2017 | Nakata | H01L 21/467 |
| 2017/0200790 A1 * | 7/2017 | Hitora | H01L 29/7787 |
| 2017/0207310 A1 * | 7/2017 | Then | H01L 29/401 |
| 2017/0263743 A1 * | 9/2017 | Nakata | H01L 29/42376 |
| 2019/0043978 A1 * | 2/2019 | Makabe | H01L 29/7787 |
| 2019/0097034 A1 * | 3/2019 | Nakata | H01L 21/02576 |

* cited by examiner

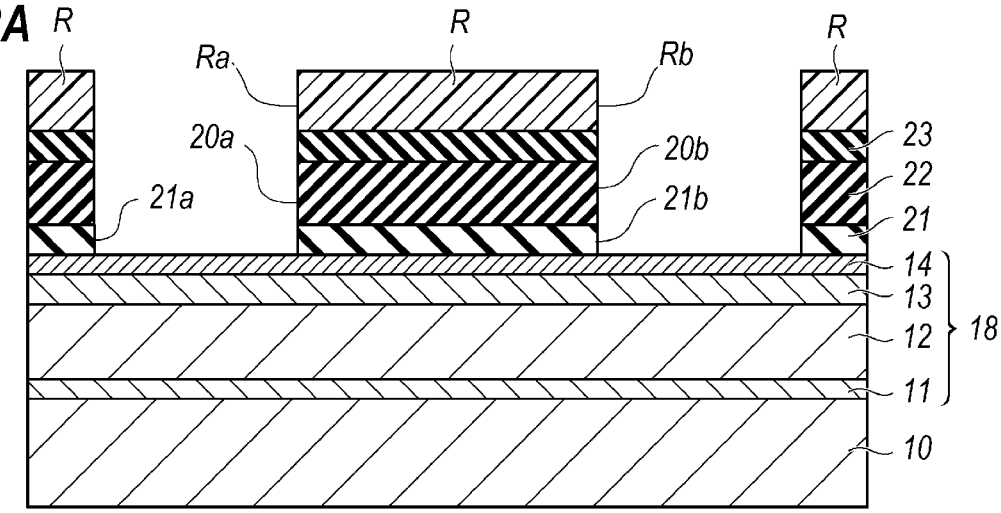
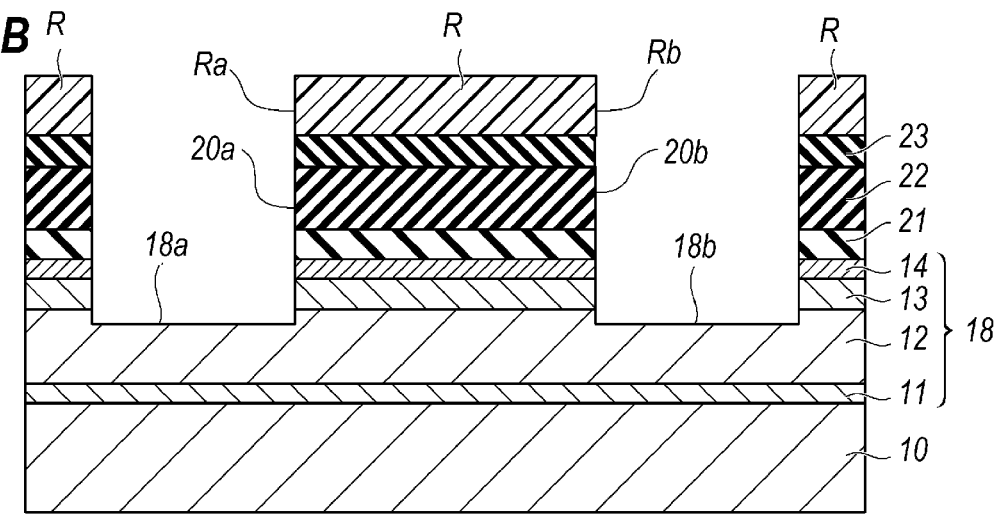
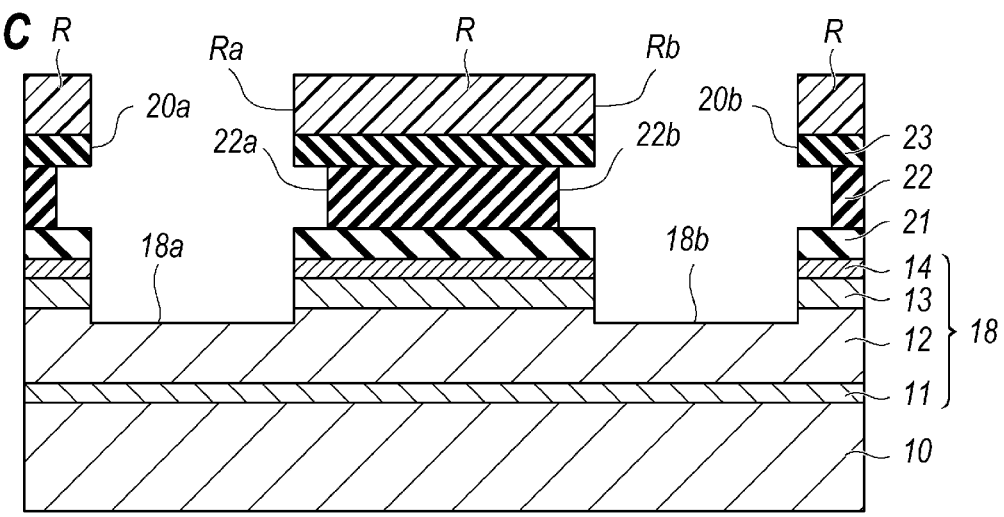

PROCESS OF FORMING NITRIDE SEMICONDUCTOR DEVICE

CROSS REFERENCE TO RELATED APPLICATIONS

The present application is based on and claims benefit of a prior Japanese Patent Application No. 2017-225868 filed on Nov. 24, 2017, the entire contents of which are incorporated herein by reference.

BACKGROUND OF INVENTION

1. Field of Invention

The present invention relates to a process of forming a nitride semiconductor device, in particular, the process of selectively growing a doped region for a source and drain electrodes.

2. Related Background Arts

A Japanese Patent Application laid open No. JP2008-227432A has disclosed a process of forming a nitride semiconductor device where the process selectively grows $n^+$ contact regions that make ohmic contacts for a source electrode and a drain electrode, then carries out a chemical mechanical polishing (CMP) for the selectively grown $n^+$ regions.

It has been well known technique in a field of a manufacturing process for a nitride semiconductor device to grow a doped region for an ohmic contact selectively within a recess formed in a semiconductor layer. For instance, in order to reduce access resistance that is inevitably induced between a channel, which is formed at an interface between a channel layer and a barrier layer, and electrodes of a source and a drain in a device having a type of high electron-mobility transistor (HEMT) primarily made of nitride semiconductor materials; a recess with a depth reaching the channel is first formed then a doped region, or a doped semiconductor layer, is formed selectively within the recess. The electrodes of the source and the drain may reduce not only contact resistance thereof against the doped region but also the access resistance from the electrodes to the channel.

However, a selective growth of a semiconductor layer, in particular, a selective growth of a nitride semiconductor layer sometimes accompanies burrs in a surface, especially a surface in a periphery of the grown layer. An area where the semiconductor layer is selectively grown, in particular, a periphery of the area, is supplied with excess sources from outside of the area because the outside is covered with a mask and substantially no sources are consumed there. Thus, the selectively grown semiconductor layer in the periphery thereof tends to form a mound that sometimes causes failures in a semiconductor device. For instance, the mound forms an undulation that sometimes degrades tightness or adhesion of an insulating film deposited thereon, or, when the device provides a gate electrode with a T-shaped cross section, possibility of a short circuit between the T-shaped gate electrode and the mound in the doped region increases.

SUMMARY OF INVENTION

An aspect of the present invention relates to a process of forming a nitride semiconductor device. The process includes steps of: (a) forming insulating films on a semiconductor stack, where the insulating films includes, from a side of the semiconductor stack, a first silicon nitride (SiN) film, a silicon oxide ($SiO_2$) film, and a second SiN film; (b) forming an opening in the insulating films to expose a surface of a semiconductor stack; (c) widening the opening in the $SiO_2$ film; (d) forming a recess in the semiconductor stack; (e) growing a doped region within the recess, where the doped region is made of nitride material and the nitride material are simultaneously deposited on the second SiN film; and (f) removing the nitride material on the second SiN film by removing the $SiO_2$ film and the second SiN film with an acid solution.

BRIEF DESCRIPTION OF DRAWINGS

FIG. 3A to FIG. 3C are cross sectional views of the HEMT shown in FIG. 1 at respective steps of the process subsequent to the step shown in FIG. 2C;

DESCRIPTION OF EMBODIMENTS

Next, some embodiments according to the present invention will be described referring to drawings. The present invention, however, is not restricted to those embodiments and has a scope defined in claims attached hereto and includes all changes and modifications for elements in the claims and equivalents thereto. Also, in the description of the drawings, numerals and symbols same with or similar to each other will refer to elements same with or similar to each other without duplicating explanations.

Figure 1:
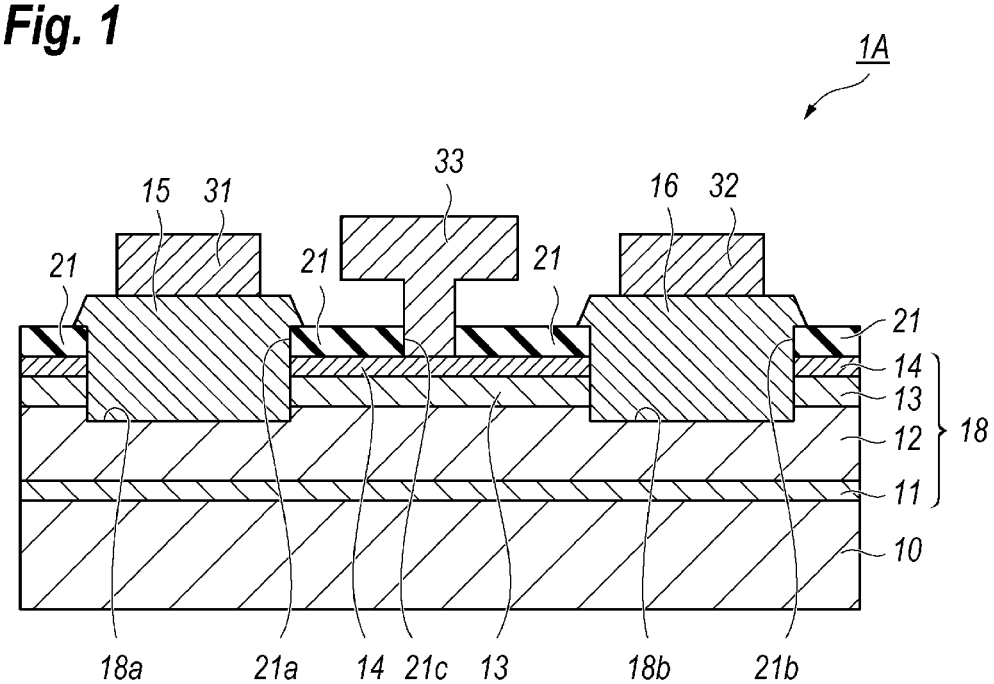
FIG. 1 is a cross sectional view of a semiconductor device type of high electron mobility transistor (HEMT) formed by a process according to an embodiment of the present invention.

FIG. 1 is a cross sectional view of a nitride semiconductor device formed by a process according to an embodiment of the present invention, where the semiconductor device 1A has a type of high electron mobility transistor (HEMT). The HEMT 1A includes a substrate 10, a semiconductor stack 18, a silicon nitride (SiN) film 21, and electrodes of a source 31, a drain 32, and a gate 33. The semiconductor stack 18 includes, from a side of the substrate 10, a buffer layer 11, a channel layer 12, a barrier layer 13, and a cap layer 14, where the channel layer 12 and the barrier layer 13 may induce a two dimensional electron gas (2DEG) in the channel layer 12 at an interface therebetween. The 2DEG may be a channel of the HEMT 1A.

The substrate 10, which is prepared for epitaxially growing semiconductor layers thereon, may be made of gallium nitride (GaN), silicon carbide (SiC), sapphire ($Al_2O_3$), silicon (Si), and/or diamond (C). The substrate 10 may have a plane primary surface on which the semiconductor layers, 11 to 14, are epitaxially grown. The buffer layer 11, which is grown on the substrate 10, is provided for enhancing quality of the channel layer 12 and the barrier layer 13 when channel layer 12 forms a hetero-interface against the substrate 10 such as SiC, $Al_2O_3$, Si, and so on. The buffer layer 11 may be made of one of nitride semiconductor materials, typically aluminum nitride (AlN).

The channel layer 12, which is epitaxially grown on the buffer layer 11, forms the 2DEG at the interface against the barrier layer 13, where the 2DEG becomes a channel of the HEMT 1A, within which a current flows from the drain electrode 32 to the source electrode 31. The channel layer 12 may be made of gallium nitride (GaN) with a thickness of 0.2 to 2.0 μm.

The barrier layer 13, which is epitaxially grown on the channel layer 12, may be made of nitride semiconductor material having bandgap energy greater than that of the channel layer 12. Exactly, the barrier layer 13 has electron affinity smaller than that of the channel layer 12, where the electron affinity is defined as energy necessary to extract one electron from a nucleus to carry the electron to infinity. Specifically, the barrier layer 12 may be made of one of aluminum gallium nitride (AlGaN), indium aluminum nitride (InAlN), and indium aluminum gallium nitride (InAlGaN). The present embodiment provides the barrier layer 13 made of AlGaN with a thickness of 5 to 30 nm.

The cap layer 14, which is epitaxially grown on the barrier layer 13, may be also made of nitride semiconductor material with a thickness of, for instance 1 nm, preferably, thinner than 5 nm. The present embodiment provides the cap layer 14 made of GaN or n-type GaN. The HEMT 1A may omit the cap layer 14.

The HEMT 1A further provides doped regions, 15 and 16, that are buried within the semiconductor stack 18. Specifically, the doped regions, 15 and 16, fill recesses, 18a and 18b, that are formed in a surface of the semiconductor stack 18 and in bottoms thereof reaching the channel layer 12 piercing the cap layer 14 and the barrier layer 13. The recesses, 18a and 18b, in respective bottoms thereof are formed by the channel layer 12, which means that the doped regions, 15 and 16, burying the recesses, 18a and 18b, are in contact with the channel layer 12 and the interface between the channel layer 12 and the barrier layer 13, that is the channel of the HEMT 1A.

The doped regions, 15 and 16, which are provided to reduce access resistance between the electrodes, 31 and 32, of the source and the drain and the channel, has doping density of $1.0 \times 10^{18} \sim 1.0 \times 10^{20}$ cm$^{-3}$, which is considerably higher than the doping density of the channel layer 12 and that of the barrier layer 12. The doped regions, 15 and 16, which may be made of gallium nitride (GaN), aluminum gallium nitride (AlGaN) and so on, exposes surfaces thereof from the semiconductor stack 18 on which the source electrode 31 and the drain electrode 32 are formed. The electrodes of the source 31 and the drain 32 make ohmic contacts against the respective doped regions, 15 and 16. The electrodes of the source 31 and the drain 32 in direct contact with the doped regions, 15 and 16, respectively, may reduce the contact resistance thereof compared with an arrangement where the electrodes, 31 and 32, are in contact with the barrier layer 13 and/or the channel layer 12 without interposing the doped regions, 15 and 16. The cap layer 14 and the barrier layer 13 forms a hetero barrier therebetween that operates as a barrier for carrier transportation from the electrodes, 31 and 32, to the channel. The doped regions, 15 and 16, secure a distance therebetween that is greater than 0.5 μm but smaller than 3.0 μm, typically around 1.0 μm. Shorter distance between the doped regions, 15 and 16, may reduce the access resistance of the HEMT 1A and enhance the high frequency performance thereof.

The electrodes of the source 31 and the drain 32 may be formed by alloying stacked metals of titanium (Ti) and aluminum (Al), where Ti may be replaced to tantalum (Ta). The stacked metals may further provide another Ti or Ta on Al. The HEMT 1A of the present embodiment has the electrodes of the source 31 and the drain 32 that are formed on the doped regions, 15 and 16, but those electrodes, 31 and 32, do not cover the whole of the doped regions, 15 and 16. That is, those electrodes, 31 and 32, leave peripheries of the doped regions, 15 and 16, not overlapped with the electrodes, 31 and 32.

The SiN film 21, which covers the semiconductor stack 18, provides openings, 21a to 21c, each corresponding to the electrodes of the source 31, the drain 32, and the gate 33. That is, the doped regions, 15 and 16, fill the openings, 21a and 21b, and have top levels thereof that are higher than a level of a top surface of the SiN film 21. Also, the doped regions, 15 and 16, have respective peripheries extending on the SiN film 21. The opening 21c has a width that determines the gate length of the HEMT 1A.

The gate electrode 33, which is provided between the source electrode 31 and the drain electrode 32, has a cross section of a T-character with a vertical bar filling the opening 21c in the SiN film 21 and a bottom of the vertical bar is in contact with the semiconductor stack 18. The gate electrode 33 in the vertical bar thereof is in contact with the cap layer 14 in the top of the semiconductor stack 18, but the gate electrode 33 in the vertical bar thereof may be in contact with the barrier layer 13. The gate electrode 33 has other stacked metals of nickel (Ni) and gold (Au), where Ni is in contact with the semiconductor stack 18 to form a Schottky contact thereto. In an alternative, Ni may be replaced to platinum (Pt).

Next, a process of forming the HEMT 1A will be described referring to FIG. 2A to FIG. 2C, FIG. 3A to FIG. 3C, FIG. 4A to FIG. 4C, FIG. 5A and FIG. 5B, where those figures shows steps of the process of forming the HEMT 1A by respective cross sectional views of the HEMT 1A.

Figure 2A:
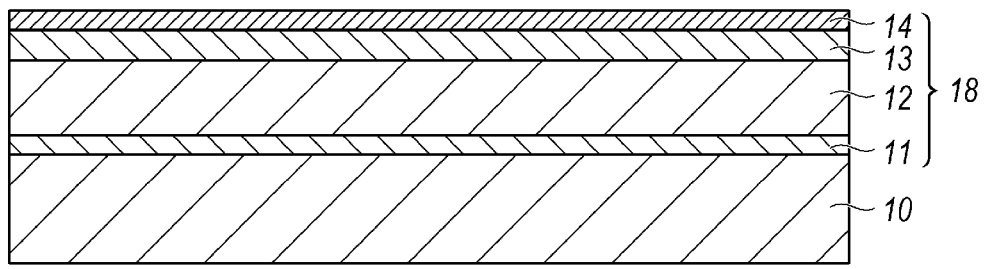
FIG. 2A to FIG. 2C are cross sectional views of the HEMT shown in FIG. 1 at respective steps of the process according to the embodiment of the present invention.
Figure 2B:
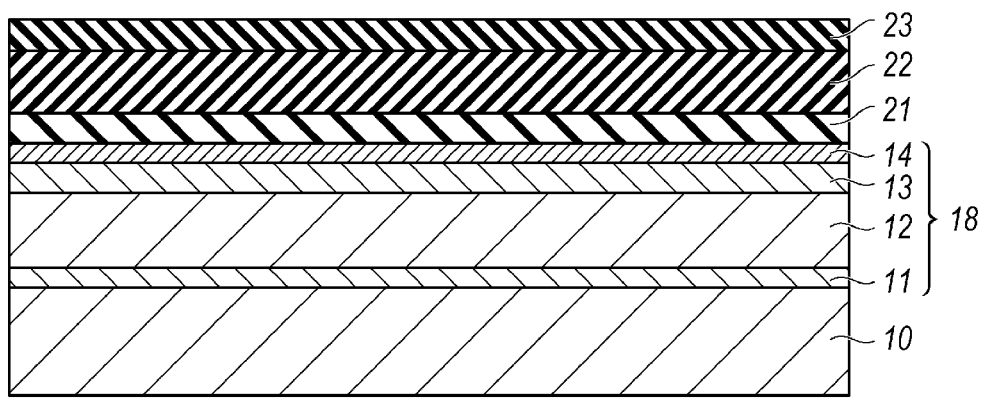

First, as shown in FIG. 2A, the semiconductor stack 18 is formed on the substrate 10 by a sequential epitaxial growth of the layers using, for instance, metal organic chemical vapor deposition (MOCVD) technique. Specifically, an AlN buffer layer 11 is grown on the substrate 10, a GaN channel layer 12 is grown on the AlN buffer layer 11, AlGaN or InAlN barrier layer 13 is grown on the GaN channel layer 13, and an n-type GaN cap layer 14 is grown on the barrier layer. The epitaxial growth of the layers, 11 to 14, by the MOCVD technique uses tri-methyl-aluminum (TMA) and tri-methyl-gallium (TMG) as source materials of group III elements, namely, Al and Ga; while, the epitaxial growth uses ammonia ($NH_3$) as a source material of nitrogen N. When the barrier layer is made of InAlN, the epitaxial growth may use tri-methyl-indium (TMI) as a source for In.

Thereafter, a tri-fold insulating film covers the semiconductor stack 18, where the insulating film includes, from the side of the semiconductor stack 18, the SiN film 21, which is the first SiN film, an silicon oxide ($SiO_2$) film 22, and another SiN film 23, which is the second SiN film. The first SiN film 21 is preferably dense and tight for protecting the semiconductor stack 18 at a high temperature during the growth of the doped regions, 15 and 16. The present embodiment forms the first SiN film 21 by, for instance, low pressure chemical vapor deposition (LPCVD) technique and/or by the MOCVD technique subsequent and sequentially to the growth of the semiconductor stack 18 as an in-situ process. The LPCVD technique may form the first SiN film 21 using source gases of mono-silane ($SiH_4$) and ammonia ($NH_3$) and at a temperature of 800 to 900° C.

The $SiO_2$ film 22 may be formed by ordinal pressure chemical vapor deposition technique, which may be sometimes called as a thermal CVD, or a plasma-assisted CVD (p-CVD), and/or sputtering. The $SiO_2$ film 22 has a thickness enough greater than that of the first SiN film 21, for instance, the $SiO_2$ film 22 has a thickness of 100 to 400 nm, typically 200 nm. The second SiN film 23, which may be also formed by the thermal CVD, the p-CVD, and/or sputtering, has a thickness of 40 to 50 nm, typically 40 nm.

Figure 2C:
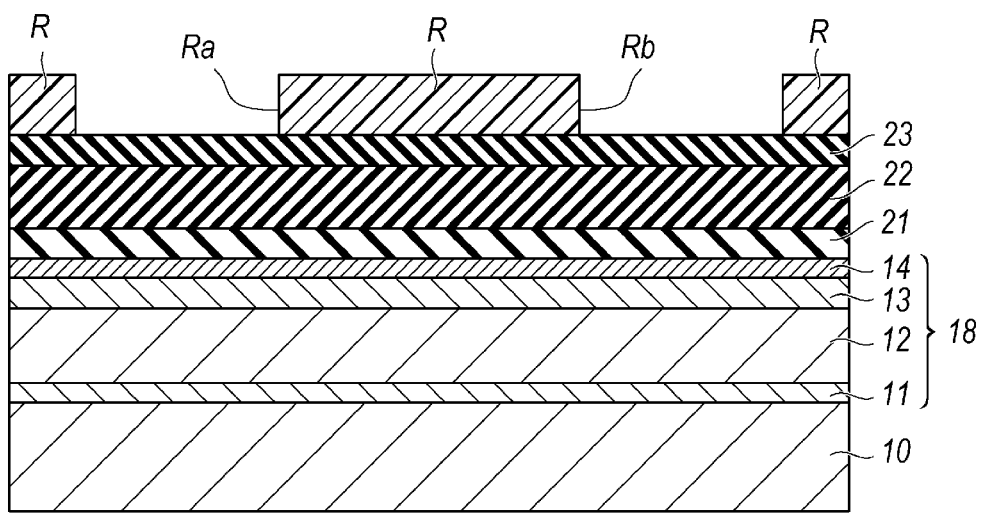

Thereafter, as shown in FIG. 2C, a patterned photoresist R that provides openings, Ra and Rb, is prepared on the second SiN film 23. Specifically, a sequential photolithography of spin-coating the second SiN film 23 with the photoresist, performing the exposure, and finally developing the photoresist, the patterned photoresist with openings, Ra and Rb, is formed on the second SiN film 23. The openings, Ra and Rb, correspond to the recesses, 18a and 18b, and two openings, Ra and Rb, have dimensions substantially equal to each other.

Thereafter, as shown in FIG. 3A, the dry-etching such as reactive ion etching (RIE) forms openings, 20a and 20b, in the second SiN film 23, the $SiO_2$ film 22, and the first SiN film 21, where the openings, 20a and 20b, fully pierce the those insulating films, 21 to 23. The RIE may use a reactive gas of one of sulfur hexafluoride ($SF_6$), tetra-fluoro-methane ($CF_4$), tri-fluoro-methane ($CHF_3$), hexa-fluoro-propylene ($C_3F_6$), and hexa-fluoro-ethane ($C_2F_6$). Because such fluoride may selectively etch materials containing silicon (Si) against nitride semiconductor materials; the RIE using fluoride may etch the insulating films, 21 to 23, but hard or almost impossible to etch the semiconductor stack 18. Also, the RIE may form the openings, 20a and 20b, with respective sides substantially perpendicular to the primary surface of the substrate 10. The top surface of the nitride semiconductor stack 18 is exposed within the openings, 20a and 20b.

Thereafter, as shown in FIG. 3B, the process forms the recesses, 18a and 18b, in the semiconductor stack 18 in portions exposed by the openings, 20a and 20b, by etching the semiconductor stack 18 using a reactive gas containing chlorine (Cl) using the insulating films, 21 to 23, as an etching mask. The reactive gas containing Cl, contrary to fluoride, may selectively etch nitride semiconductor materials in the semiconductor stack 18 against the insulating films, 21 to 23, containing Si. The RIE of the present process fully etches the cap layer 14 and the barrier layer 13 within the openings, 20a and 20b, but partially etches the channel layer 12; that is, the recesses, 18a and 18b, in respective bottoms thereof reach the channel layer 12. Because the 2DEG is formed at the interface between the channel layer 12 and the barrier layer 13, exactly, in the channel layer 12 at the interface against the barrier layer 13, the recesses, 18a and 8b, expose the edge or the end of the 2DEG in respective side walls of the recesses, 18a and 18b, which means that the doped regions, 15 and 16, to be formed within the recesses, 18a and 18b, may be in direct contact with the edge of the 2DEG, which reduce the access resistance from the electrodes, 31 and 32, to the 2DEG.

Thereafter, as shown in FIG. 3C, the process widens the openings, 20a and 20b, selectively in the $SiO_2$ film 22; that is, the process retreats the edge of the $SiO_2$ film 22 from edges of the first SiN film 21 and the second SiN film 23. A buffered hydrochloric (HF) acid may selectively etch the $SiO_2$ film 22 against the first and second SiN films, 21 and 23. The $SiO_2$ film 22 may retreat from the SiN films, 21 and 23, by 100 to 200 nm. The second SiN film 23 deposited on the $SiO_2$ film 22 forms an overhang with a length of 100 to 200 nm. Because the $SiO_2$ film 22 is retreated from the edges of the SiN films, 21 and 23, the doped regions, 15 and 16, preferably form a gap therebetween at least 0.5 μm. A gap narrower than 0.5 μm possibly removes the $SiO_2$ film 22 necessary to be left between the doped regions, 15 and 16.

The process thus described etches the semiconductor stack 18 to form the recesses, 18a and 18b, after forming the openings, 20a and 20b, but before widening the openings, 20a and 20b, in the $SiO_2$ film 22. In an alternative, the process may form the recesses, 18a and 18b, after the step of widening the openings, 20a and 20b, in the $SiO_2$ film 22. That is, the step of forming the recesses, 18a and 18b, may be carried out after forming the openings, 20a and 20b, independent of the step of widening the opening in the $SiO_2$ film 22. Such a procedure may also form the overhang in the insulating films, 22 and 23, and the recesses, 18a and 18b, in the semiconductor stack 18.

Thereafter, the patterned photoresist R on the second SiN film 23 is removed. Also, the step of the removal of the photoresist R is not restricted to a procedure after the formation of the recesses, 18a and 18b. The patterned photoresist R may be removed in any steps after the formation of the openings, 20a and 20b.

Figure 4A:
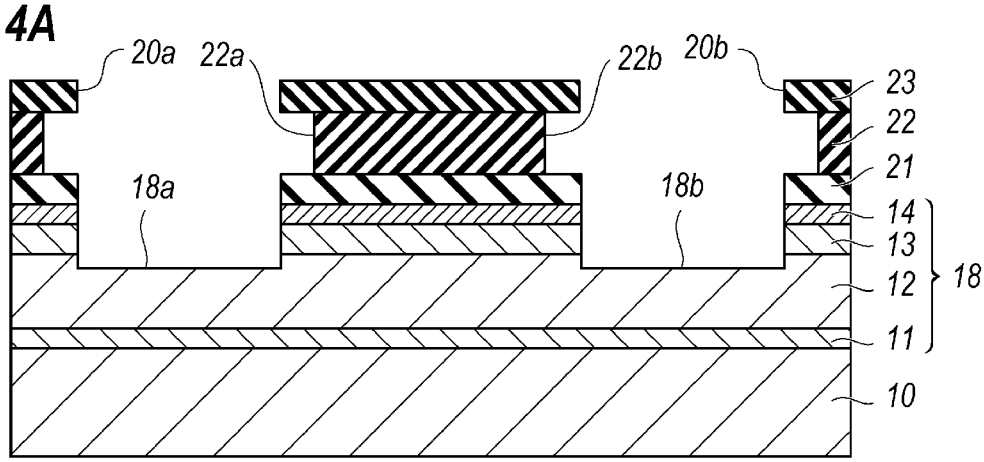
FIG. 4A to FIG. 4C are cross sectional views of the HEMT shown in FIG. 1 at respective steps of the process subsequent to the step shown in FIG. 3C.
Figure 4B:
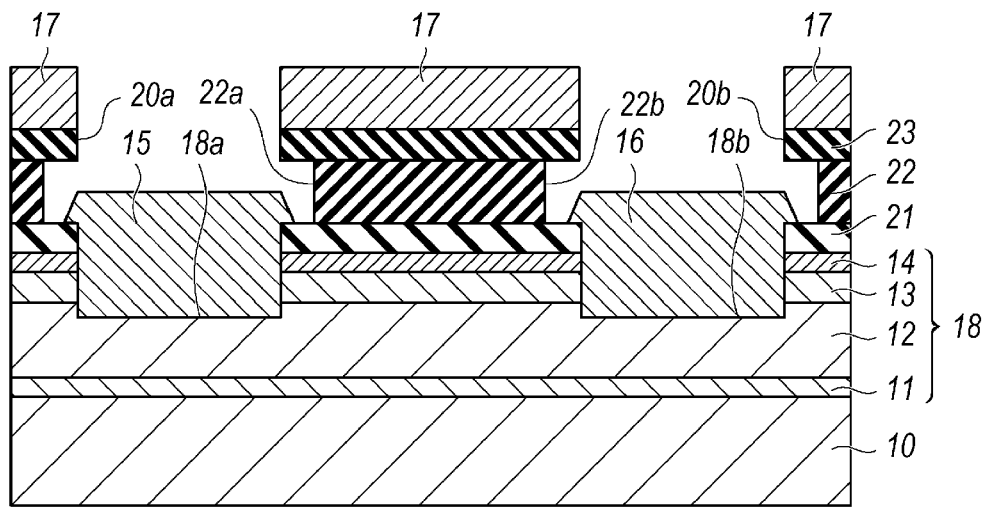

Thereafter, as shown in FIG. 4B, the doped regions, 15 and 16, are selectively grown within the recesses, 18a and 18b, using, for instance, the MOCVD, a molecular beam epitaxy (MBE), and so on. The doped regions, 15 and 16b, may be made of $n^+$ type GaN, or $n^+$ type AlGaN, doped with silicon (Si). When the MOCVD is used for re-growing the doped regions, 15 and 16, the MOCVD may use monosilane ($SiH_4$) as a source material for doping Si. The first SiN film 21 has a thickness at least 5 nm, preferably 5 to 20 nm, while, the $SiO_2$ film 22 preferably has a thickness greater than a thickness of the doped regions, 15 and 16. The present embodiment re-grows the doped regions, 15 and 16, by a thickness at least 100 nm. Because the edge of the $SiO_2$ film 22 retreats from the edges of the first and second SiN films, 21 and 23, the doped regions, 15 and 16, may re-grow not only within the recesses, 18a and 18b, but on the first SiN film 21 in a periphery of the openings, 20a and 20b.

The re-growth is generally performed at a temperature of, for instance, 800~1000° C., which accelerates oxidation of the re-grown layer when an oxide material exists on the substrate 10. In the present embodiment, the second insulating film made of $SiO_2$ exists closer to the semiconductor stack 18. However, the first SiN film 21 is interposed between the $SiO_2$ film 22 and the semiconductor stack 18, which prevents the oxidization of the surface of the semiconductor stack 18. Moreover, the first SiN film 21 is formed continuous to the growth of the semiconductor stack 18 without exposing the semiconductor stack in atmosphere or, the SiN film 21 is formed by the LPCVD technique; accordingly, the first SiN film 21 is stable in a high temperature during the re-growth of the doped regions, 15 and 16. The first SiN film 21 is preferably deposited at a temperature higher than a temperature of re-growing the doped regions, 15 and 16, and the first SiN film 21 preferably has a thickness at least 5 nm to suppress or substantially prevent the surface of the semiconductor stack 18 from being oxidized by oxygens contained in the $SiO_2$ film 22. The re-growth of the doped regions, 15 and 16, simultaneously deposits nitride materials on the second SiN film 23, where the nitride materials are sources for the doped regions, 15 and 16. Because nitride materials are hard to be grown as a single crustal on a non-crystalized material, such as the second SiN film 23; the nitride materials 17 on the second SiN film 23 are poly crystal, or sometimes clusters.

Figure 4C:
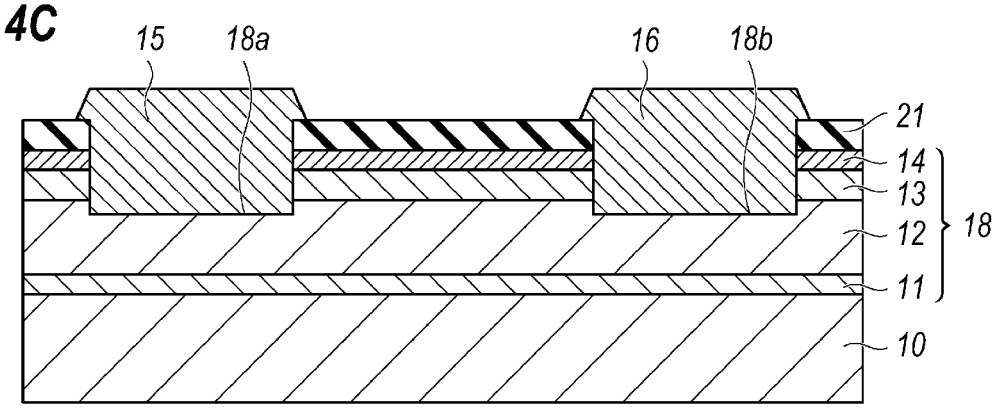

Thereafter, the process removes nitride materials 17 deposited on the second SiN film 23 during the re-growth of the doped regions, 15 and 16, by removing the $SiO_2$ film, which is shown in FIG. 4C. Specifically, a buffered hydrochloric (HF) acid may selectively remove the $SiO_2$ film 22 with respect to the first and second SiN films, 21 and 23. Etching rates of a $SiO_2$ film and a SiN film by a buffered hydrochloric acid are 200 to 300 nm/minutes and 0.3 nm/minutes or smaller, respectively. Accordingly, selective etching of the $SiO_2$ film 22 against the SiN films, 21 and 23, may be easily carried out. Also, removing or solving the $SiO_2$ film 22, the second SiN film 23 accompanied with the nitride materials 17 thereon may be removed, which is called as a lift-off technique.

In an alternative, the first SiN film 21 may be removed after the selective removal of the $SiO_2$ film at the lift-off process above described, which leaves the doped regions, 15 and 16, on the semiconductor stack 18, and the whole surface of the semiconductor stack 18 is exposed. Thereafter, another SiN film may cover the whole surface of the semiconductor stack 18 and the doped regions, 15 and 16.

Because the second SiN film 23 forms the overhang against the $SiO_2$ film 22, the nitride materials 17 deposited on the second SiN film 23 is not in contact with the doped regions, 15 and 16. That is, the overhang in the second SiN film 23 may form a gap between the nitride materials 17 and the doped regions, 15 and 16, which enables an etchant, namely, the buffered hydrochloric (HF) acid, to be securely in contact with the $SiO_2$ film 22 and accelerates the etching of the $SiO_2$ film 22. Moreover, the overhang in the second SiN film 23, or the retreated $SiO_2$ film 22 may suppress uneven supply of source materials for the re-growth of the doped regions, 15 and 16, in peripheries of the recesses, 18a and 18b, namely, the peripheries of the doped regions, 15 and 16, which may effectively prevent the doped regions, 15 and 16, from forming burrs or mounds in the peripheries thereof.

In order to securely form the overhang during the re-growth, the second SiN film 23 is preferably formed such that the second SiN film 23 leaves a thickness at least 20 nm after widening the openings, 20a and 20b, by the dry-etching at the step shown in FIG. 2A. Securely left overhang in the second SiN film 23 may effectively isolate the doped regions, 15 and 16, from the nitride materials 17 deposited on the second SiN film 23.

The doped regions, 15 and 16, preferably have a thickness thereof thinner than a thickness of the $SiO_2$ film 22 to prevent the nitride materials 17 deposited on the second SiN film 23 from being continuous to the doped regions, 15 and 16, or the doped regions, 15 and 16, in top levels thereof are preferably lower than a top level of the $SiO_2$ film 22, which may securely isolate the doped regions, 15 and 16, from the nitride materials 17 on the second SiN film 23.

Thereafter, the process forms the electrodes of the source 31 and the drain 32 on the doped regions, 15 and 16, respectively. Specifically, the process stacks metals of titanium (Ti), aluminum (Al) and other titanium (Ti) on the doped regions, 15 and 16, where Ti may be replaced to tantalum (Ta). A metal evaporation may be used for stacking those metals. Then, the stacked metals are alloyed at a temperature of 500 to 600° C., where the present embodiment alloys the stacked metals of Ta/Al/Ta at a temperature of 550° C.

Figure 5A:
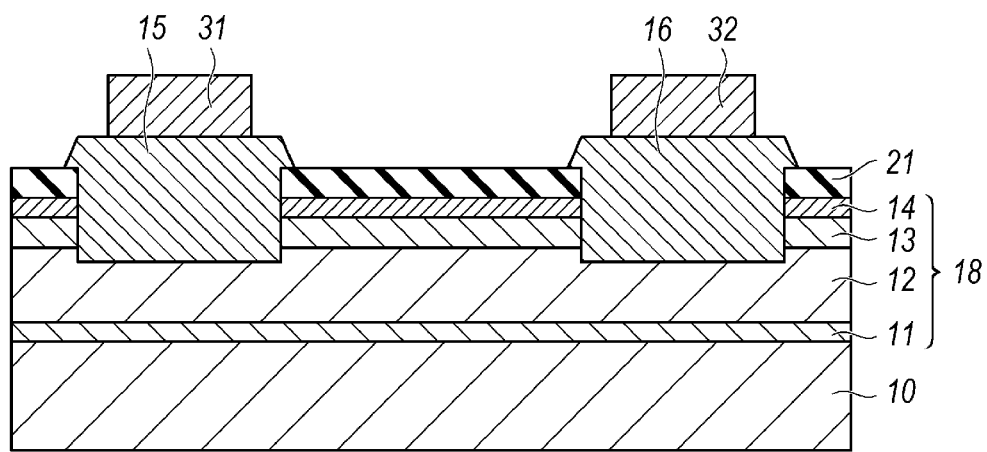
FIG. 5A and FIG. 5B are cross sectional views of the HEMT shown in FIG. 1 at respective steps of the process subsequent to the step shown in FIG. 4C.
Figure 5B:
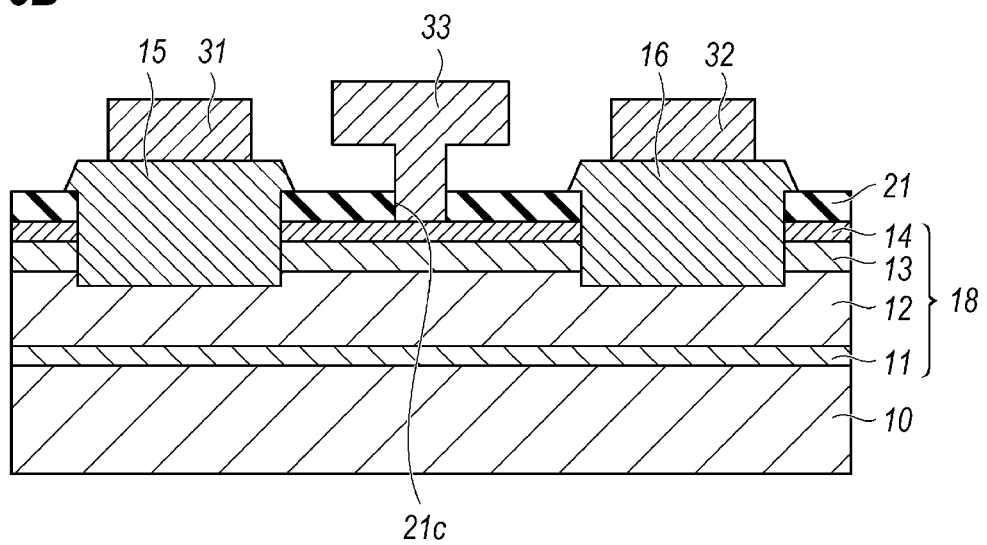

Thereafter, as shown in FIG. 5B, the gate electrode 33 is formed on the semiconductor stack 18 between the source electrode 31 and the drain electrode 32. The process first prepares a patterned photoresist on the first SiN film 21, which is not shown in the figures, by an ordinary photolithography, or an electron beam exposure; then etches the first SiN film 21 using the patterned photoresist as an etching mask to form a gate opening 21c that exposes the semiconductor stack 18. Thereafter, a conventional technique, such as a metal evaporation, stacks metals of, for instance, nickel (Ni), palladium (Pd), and gold (Au), Ni/Pd/Au, on the semiconductor stack 18 and also on the patterned photoresist. Residual metals deposited on the patterned photoresist may be removed by solving the patterned photoresist with a solvent, which is generally called as the lift-off technique. The gate electrode may have a T-shaped cross section, as shown in FIG. 5B, where a horizontal bar of the T-character may overlap with the doped regions, 15 and 16. This arrangement is realized by the doped regions, 15 and 16, with no mound in the periphery thereof. A shortened gap between the T-shaped gate electrode 33 and the doped regions, 15 and 16, may be effective to reduce the access resistance from the electrodes of the source 31 and the drain 32 to the channel.

Thus, the process of forming the HEMT 1A according to the present invention is completed. The HEMT 1A may further provide an insulating film made of, for instance, silicon nitride (SiN) to cover a whole surface of the first SiN film 21, the electrodes of the source 31, the drain 32, and the gate 33, where the SiN film is often called as a passivation film to electrically and mechanically covers and protects the HEMT 1A. Forming openings in the passivation film, interconnections for the respective electrodes, 31 to 33, may be formed so as to be in contact with the electrodes through the respective openings in the passivation film.

The process of forming the HEMT 1A of the present embodiment may effectively and securely divide the nitride materials 17 deposited on the second SiN film 23 from the doped regions, 15 and 16, selectively grown within the recesses, 18a and 18b, by the existence of the overhang formed in the second SiN film 23 against the $SiO_2$ film 22. The overhang in the second SiN film 23 may effectively prevent the selectively grown doped regions, 15 and 16, from causing the mound in the periphery thereof. The doped regions, 15 and 16, with no mounds may form the gate electrode 33 closer thereto, which reduces the access resistance from the electrodes of the source 31 and the drain 32 to the channel without degrading the voltage endurance of the HEMT 1A.

Also, the doped regions, 15 and 16, causing no mounds in the periphery thereof may enhance the adhesion or tightness of the insulating film, namely, the passivation film covering the doped regions, 15 and 16, and the electrodes, 31 to 33. The process disclosed in the prior patent document described above has used a mask for the re-growth of a semiconductor layer, where the mask is made of only $SiO_2$. However, oxygen contained in $SiO_2$ film possibly oxidizes a surface of the semiconductor stack during the re-growth of the doped regions, 15 and 16. A modified process using a mask made of SiN for the re-growth, such a SiN film is hardened exposed in a high temperature of the re-growth, which makes hard or substantially impossible to remove the hardened SiN film by a hydrochloric acid. The process according to the present invention may provide one solution for subjects of the oxidization of the surface of the semiconductor layer on which the doped region is to be selectively grown and the simplicity to remove the mask for the selective growth.

While particular embodiments of the present invention have been described herein for purposes of illustration, many modifications and changes will become apparent to those skilled in the art. For instance, the embodiment thus described concentrates on a semiconductor device type of HEMT. However, the process according to the present invention using a double layered insulating mask for the selective growth may be applicable to other types of a semiconductor device, or a process of re-growing a semiconductor layer. Accordingly, the appended claims are intended to encompass all such modifications and changes as fall within the true spirit and scope of this invention.

What is claimed is:

1. A process of forming a nitride semiconductor device, the process comprising steps of:
   forming insulating films on a top surface of a semiconductor stack, the insulating films including, from the top surface of the semiconductor stack, a first silicon nitride (SiN) film, a silicon oxide (SiO$_2$) film, and a second SiN film;
   forming an opening in the insulating films to expose the top surface of the semiconductor stack;
   widening the opening formed in the SiO$_2$ film;
   forming a recess in the semiconductor stack by using the insulating films as an etching mask;
   growing a doped region made of nitride semiconductor material within the recess, the growing of the doped region resulting in nitride semiconductor material being deposited on the second SiN film; and
   removing the nitride semiconductor material deposited on the second SiN film and the second SiN film by removing the SiO$_2$ film.

2. The process according to claim 1,
   wherein the step of forming insulating films forms the first SiN film to have a thickness of at least 5 nm and the SiO$_2$ film to have a thickness of at least 100 nm.

3. The process according to claim 2,
   wherein the step of forming insulating films forms the second SiN film to have a thickness of 40 to 50 nm.

4. The process according to claim 1,
   wherein the step of widening the opening in the SiO$_2$ film retreats an edge of the SiO$_2$ film in the opening from an edge of the second SiN film in the opening by 100 to 200 nm.

5. The process according to claim 1,
   wherein the step of growing a doped region grows the nitride semiconductor layer to have a thickness smaller than a thickness of the SiO$_2$ film.

6. The process according to claim 1,
   wherein the step of forming insulating films forms the first SiN film by a low pressure chemical vapor deposition (LPCVD) process at a temperature of 800 to 900° C.

7. The process according to claim 1,
   wherein the step of forming insulating films forms the first SiN film within a furnace, in which the semiconductor stack is grown, subsequent to forming the semiconductor stack without exposing the semiconductor stack to atmosphere.

8. The process according to claim 1,
   wherein the step of forming a recess in the semiconductor stack is carried out before the step of widening the opening in the SiO$_2$ film.

9. The process according to claim 1,
   wherein the step of forming a recess in the semiconductor stack is carried out after the step of widening the opening in the SiO$_2$ film.

10. The process according to claim 1,
    further including a step of growing the nitride semiconductor layers on a substrate before the step of forming insulating films, the nitride semiconductor layers including, from the top surface of the substrate, a buffer layer, a channel layer of gallium nitride (GaN), and a barrier layer of aluminum gallium nitride (AlGaN),
    wherein the step of forming a recess is carried out such that the recess in a bottom thereof reaches the channel layer.

11. The process according to claim 10,
    wherein the step of growing the nitride semiconductor layers further grows a cap layer of n-type gallium nitride on the barrier layer.

12. The process according to claim 10,
    wherein the step of growing a doped region dopes n-type impurities by a density greater than a density of impurities in the channel layer and the barrier layer.

* * * * *